United States Patent [19]
Graninger et al.

[11] Patent Number: 5,040,995
[45] Date of Patent: Aug. 20, 1991

[54] ADAPTER CARD FOR MULTITERMINAL PANEL CONTROLS

[75] Inventors: Frank J. Graninger, Milwaukee; Dennis L. Schmidt, Oconomowoc, both of Wis.

[73] Assignee: Allen-Bradley Company, Inc., Milwaukee, Wis.

[21] Appl. No.: 533,547

[22] Filed: Jun. 5, 1990

[51] Int. Cl.$^5$ ............................................. H01R 9/09
[52] U.S. Cl. ..................................... 439/76; 361/395
[58] Field of Search ................... 439/638, 74, 75, 55, 439/78, 76; 200/51 R; 361/394, 395, 399

[56] References Cited
U.S. PATENT DOCUMENTS
4,736,266  4/1988  Tanibe ................................. 439/74

FOREIGN PATENT DOCUMENTS
2035716  6/1980  United Kingdom .

OTHER PUBLICATIONS
Exhibit A, Allen-Bradley Publication 800A-1.0, Sep. 1987.
Exhibit B, Allen-Bradley Publication 800T-1.2, Sep. 1977.

Primary Examiner—Neil Abrams
Assistant Examiner—Khiem Nguyen
Attorney, Agent, or Firm—Quarles & Brady

[57] ABSTRACT

An adapter for connecting industrial panel controls to a prewired harness attached to the I/O board of an industrial controller has columnar connectors which fasten to threaded terminals on the panel control and support a printed circuit card holding a standard electrical connector. Machine screws received by the panel control hold the printed circuit board against the columnar connectors. The columnar connector are attached to the printed circuit board by means of sleeve connectors to aid in assembly. Inputs and outputs from the panel controls are segregated by column of the connector to prevent erroneous connection on an input to an output.

8 Claims, 2 Drawing Sheets

ADAPTER CARD FOR MULTITERMINAL PANEL CONTROLS

BACKGROUND OF THE INVENTION

1. Field of the Invention

The field of the invention is industrial panel controls such as switches and indicator lights, and specifically adapters for use with such panel controls to permit their rapid connection to a prewired harness.

2. Background Art

Industrial panel controls include generally single and multiple contact switches and indicator lamps for use in the control of electrical equipment. Such panel controls are designed to resist the destructive effects of the industrial enviroment including temperature extremes and elevated levels of mechanical shock and vibration, and may include provisions for sealing the contacts and lamp elements against oil and water.

Ordinarily, such panel controls are wired to remote devices, such as contactors and a considerable length of wire may be required to connect the panel controls to such remote devices. In order to limit the voltage drop in the interconnecting wiring, panel controls ordinarily accommodate large gauge wire having low resistance per unit length. Connection to the wire is accomplished by means of screw terminals comprising conductive tabs with threaded holes for receiving specially engineered machine screws ("SEMS"). The exposed conductor of the wire is captured between the head of the SEMS and the conductive tab. Frequently, a saddle clamp, constructed of a C-shaped strip of metal will be held by the SEMS against the tab so as to further guide and restrain the wire being connected. Alternatively, a "crimp connector" having a pre-formed hook or loop may be attached to the exposed conductor of the wire and fastened to the tab by the SEMS. Another construction uses a "spade" connector attached to the conductor of the wire and pressed directly onto a corresponding conductive tab of the terminal and held by friction.

In complex control applications, the panel controls may be connected directly to an industrial controller. An industrial controller provides outputs and receives inputs, to and from various devices though input/output modules (I/O modules) communicating with the industrial controller via a high speed digital link. Inputs to the industrial controller may be from the contacts of a panel control while outputs of the industrial controller may be to the terminals of an indicator lamp of a panel control. A stored program executed by the industrial controller reads the inputs and changes the outputs in response to that program, as is generally understood in the art. The panel controls and the remote devices are connected to I/O modules and effectively communicate with each other via the industrial controller.

This use of an industrial controller to mediate between panel controls and remote electrical devices offers two advantages. First, the connections between the panel controls and the remote devices may be modified simply by reprogramming the industrial controller without the time consuming and expensive rewiring of the panel controls. Second, the I/O modules may be positioned near the panel controls and thus connected with short runs of low current wiring. Long runs of wiring between the panel controls and the remote devices are eliminated by the uses of remote I/O modules communicating with the industrial controller by high speed digital links.

SUMMARY OF THE INVENTION

The use of an industrial controller as an interface between the panel controls and their associated remote devices allows the wiring runs from the panel controls to be much more predictable. Each switch and each light of the panel controls is connected directly to an I/O module and therefore, a standard cabinet for holding the panel controls, and a prewired harness for connecting the panel controls to the I/O modules may be used.

The harness may have a set of wires for each switch contact and each indicator lamp of the panel control, so as to connect the panel control to the I/O module. The use of a prewired harness may save considerable expense, not only by reducing the time required to wire the panel controls, but also by reducing wiring errors.

A further reduction in wiring time and potential wiring errors may be realized by using standard connectors to connect the harness to the panel controls, rather than wiring each wire of the harness to these panel controls by means of the screw terminals.

Switches and indicator lamps with integral connectors rather than screw terminals are commercially available, however, they are generally not rugged enough for use in an industrial enviorment. Further, switches and indicator lamps having connectors in lieu of screw terminals would not be appropriate for situations where both screw terminals and connectors are needed. This situation often arises with emergency stop controls. Such controls must be wired to the industrial controller but also directly to a remote device to provide a positive emergency stop in the event of damage to the industrial controller.

The design and manufacture of a separate set of industrial panel controls having an integral connector and would be prohibitively expensive.

In the present invention, an adapter provides a means of affixing a standard electrical connector to an ordinary industrial panel control having terminals. The adapter has an electrical connector for receiving a corresponding mating connector and includes one or more conducting elements attached to an insulating support. These conducting elements are electrically connected to electrical sleeve connectors also attached to the insulating support. Columnar conductors connect the terminals of the panel control to the sleeve connectors by conducting electricity between the terminals and the conducting elements of the electrical connector.

It is thus one object of the invention to attach an electrical connector to a conventional panel control to pemit the efficient use of a prewired harness for connecting the panel control to an industrial controller or the like. The connector permits the rapid connection of the harness to the panel control without separately attaching each wire of the harness.

It is another object of the invention to permit the manufacture of a single line of panel controls that may be used with or without a prewired harness. The columnar conductors attach to the terminals of the panel control to conduct electricity to the standard electrical connector. When the columnar conductors are removed, the panel control may be used with conventional wiring techniques.

It is yet another object of the invention to permit a single panel control to be wired at once both in a conventional manner and with a prewired harness. The contacts whose terminals are not connected to the standard connector by means of the columnar conductors are available for receiving individual wires to be held by means of a saddle clamp and SEMS or similar conventional wiring techniques.

Another object of the invention is to provide a mechanically simple means for mechanically attaching a connector to a standard panel control. In one embodiment, a clamping means received by panel control presses the insulating support holding the electrical connector toward columnar conductors. The columnar conductors as connected to the sleeve connectors on the insulating support, include a shoulder for capturing the insulating support and holding the electrical connector between the clamping means and the shoulder. The columnar conductors hence provide both electrical connection and mechanical support.

It is a further object of the invention to provide a means of using standard electrical connectors with a variety of different panel controls but ensuring correct connection to the prewired harness. The conducting elements of the electrical connector are arranged in groups of four along the vertices of a square to form a first and second column on the insulating support. The input terminals of the panel control are connected only to the first column and the output terminals of the panel control are connected only to the second column. The shell of the electrical connector is keyed to ensure that the harness connector may mate with the connector in only one orientation. Hence inputs to the I/O board of the industrial controller may not be inadvertently connected to the inputs of the panel controls nor may outputs of the panel controls be inadvertently connected to outputs of the I/O board as will be discussed further below.

Other objects and advantages besides those discussed above shall be apparent to those experienced in the art from the description of a preferred embodiment of the invention which follows. In the description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

DETAILED DESCRIPTION OF THE PREFERRED EMBODIMENT

Figure 1:
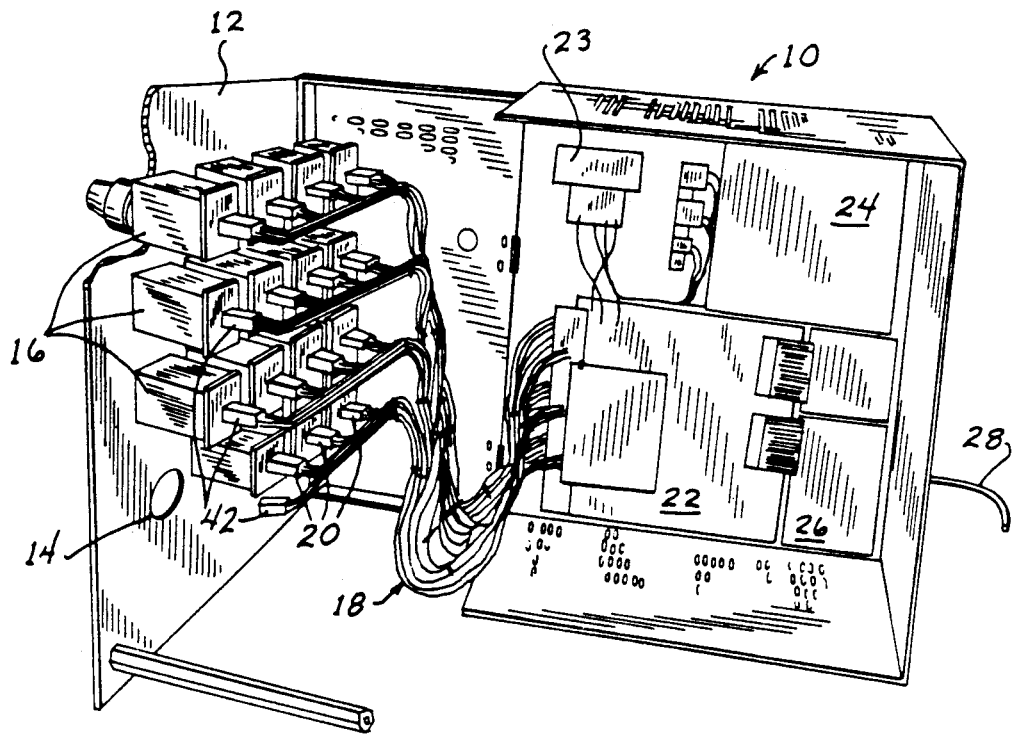
FIG. 1 is a perspective view of a cabinet having a prewired harness connecting a number of panel controls to an I/O board of an industrial controller.

Referring to FIG. 1, a standard cabinet 10 has a front panel 12 containing mounting holes 14 for a plurality of panel controls 16 such as push button switches, selector switches, and indicator lights. Electrical connection to the panel controls 16 is made by means of prewired harness 18 having cables 20 directed to each such panel control 16 and connected to the panel controls 16 by harness connectors 42. The other end of each cable 20 of the prewired harness 18 is collected and electrically connected to a remote I/O board 22 of an industrial controller (not shown). The I/O board 22 may read the status of switches in panel controls 16 connected via the harness 18 and may illuminate or extinguish the lamps associated with panel controls 16 either as part of a switch or as a pilot light.

The I/O board 22 is powered by transformer 23 and communicates directly with the industrial controller and indirectly with other I/O boards (not shown) via node adapter unit 26 connected to a high speed digital link 28. The front panel 12 fits against open face of cabinet 10 to enclose the power supply 24, the I/O board 22, the harness, 18 and the node adapter unit 26.

Figure 2:
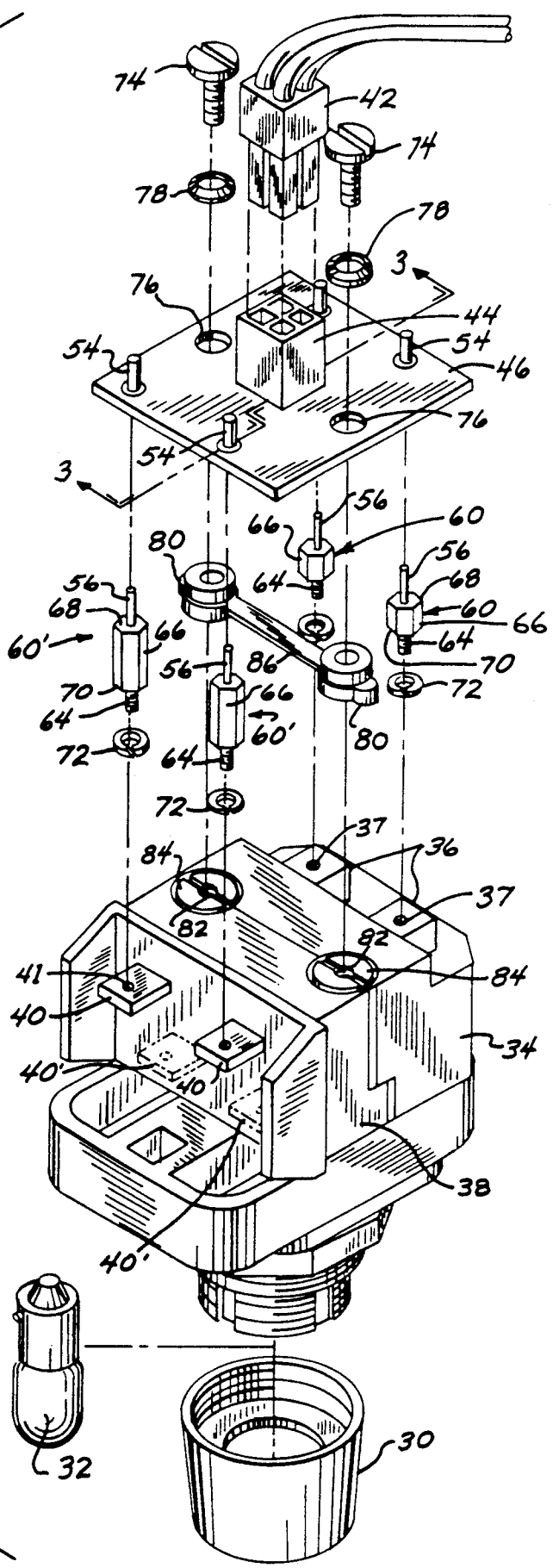
FIG. 2 is an exploded perspective view of a single pushbutton switch panel control of FIG. 1 having the adapter of the present invention.

Referring to FIG. 2, a panel control 16 has a pushbutton lens 30 containing a lamp 32 which is connected to the output of an integral transformer 34. The input of transformer 34 is connected to input terminals 36 attached to the outside of transformer 34. The terminals contain threaded holes 37 facing generally toward the rear of the panel control 16. Pressing the pushbutton lens 30 activates contacts (not shown) contained in contact block 38. The contacts are connected to output terminals 40 affixed to the outside of contact block 38. The output terminals 40 contain threaded holes 41 facing generally toward the rear of the panel control 16. In an alternative embodiment, contact block 38 may contain a second set of contacts having a second set of output terminals 40' similar to output terminals 40 but offset so as to be unobstructed toward the rear of the panel control 16.

A four wire cable 20 from the prewired harness 18 from the I/O board 22 terminates in harness connector 42 which mates with board connector 44, mounted on printed circuit board 46. The connectors 42 and 44 are standard four pin connectors such as are available from Molex Corporation under the name of "Junior Mini-Fits" and are keyed to ensure that they will fit only in a single orientation. Similar connectors are available from other manufacturers, as will be apparent to one of ordinary skill in the art.

Figure 3:
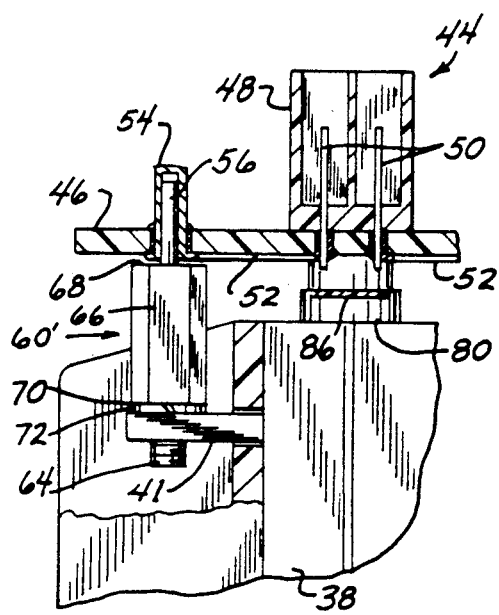
FIG. 3 is a cross-section of the printed circuit board of the adapter of FIG. 1 taken along lines 3—3 of FIG. 2.

Referring to FIGS. 2 and 3, board connector 44 comprises a generally box shaped insulating shell 48, the bottom of which fits against the upper surface of printed circuit board 46. The insulating shell 48 is partitioned into four compartments each open at the top and each holding a vertically oriented conductive pin 50 to mate with a corresponding conductive socket (not visible) on harness connector 42. The conductive pins 50 protrude down through the bottom of the insulating shell 48 and are received by holes drilled through the printed circuit board 46 and soldered to conductive traces 52 on the bottom of printed circuit board 46 by reflow soldering techniques as are known in the art.

Figure 4:
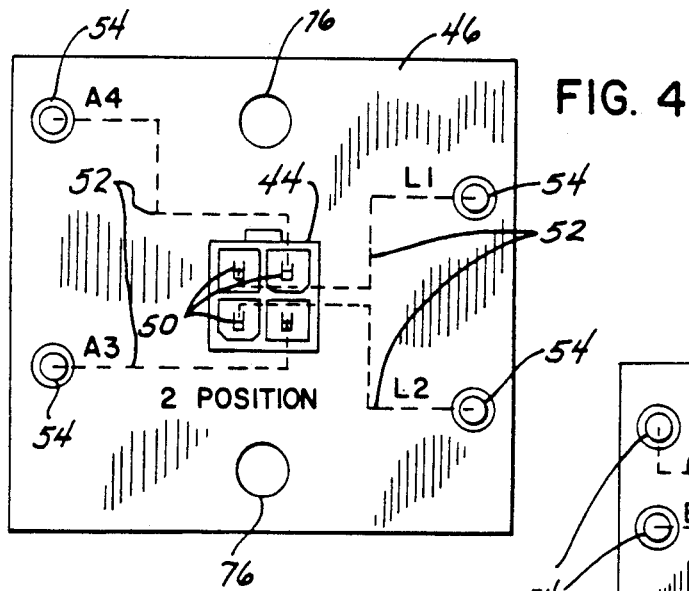
FIG. 4 is a plan view of the printed circuit board of the adapter of FIG. 2 for accepting a single harness connector for use with a panel control having a single output contact and a single indicator lamp.

As may be most easily seen in FIG. 4, the conductive pins 50 are arranged in a square pattern so that they may be divided into inputs and outputs according to their position on a first and second opposing sides of the square.

Referring now generally to FIGS. 2, 3, and 4, the conductive traces 52 serve to connect each of the conductive pins 50 of board connector 44 to a respective one of four downwardly open sleeve connectors 54 positioned at the edges of the printed circuit board 46. Referring specifically to FIG. 3, the sleeve connectors 54 are tube shaped and closed at one end with an expanded rim at the open end. The sleeve connector 54 is inserted upwardly into a hole formed in the printed circuit board 46 until the top edge of the expanded rim of the sleeve connecter 54 abuts the bottom edge of the printed circuit board 46 at the conductive trace 52. Electrical connection between the expanded rim of the sleeve connector 54 and the trace 52 is ensured also by reflow soldering, as previously described. Sleeve connectors 54 are commercially available under the name "pin socket".

Referring to FIG. 2, a first, pin end 56 of column conductor 60 is received by the sleeve connector 54 to electrically connect the column conductor 60 to the conductive trace 52 and hence to a correspondingly conductive pin 50 of the board connector 48. The pin end 56 is radially symmetrical and hence the connection formed between the pin end 56 and the connector sleeve 54 is indifferent to the orientation of the column connector 60 about its axis.

A second, threaded end 64 of the column conductor 60 has external threads for being received by internally threaded holes 37 in the input terminal 36. The body 66 of column conductor 60, between the pin end 56 and the threaded end 64 is hexagonal in cross-section to permit the use of a wrench tighten it to the terminal 37. The body is of larger radius than the pin end 56 and the threaded end 64 to form an upper shoulder 68 at the junction of the body 66 and the pin end 56 and a lower shoulder 70 at the junction of the body 66 and the threaded end 64. A lock washer 72 is placed around the threaded end 64 to be compressed between the terminal 37 and the lower shoulder 70.

Similar column conductors 60' are attached to output terminals 40 by means of threaded holes 41. The column conductors 60' are identical to column conductors 60 but for the length of their bodies 66. The bodies 66 of column conductors 60' are longer to ensure that the upper shoulders 68 of the column conductors 60 and 60' lie in the same plane when each is attached to its respective terminals 36 or 40, regardless of the relative height of the terminal 36 or 40.

The column connectors 60 and 60' are machined from solid brass and plated with tin, however it will be apparent to one skilled in the art that other materials such as tin-plated steel might also be used.

Referring again to FIG. 2, the printed circuit board 46 holding the sleeve connectors 54 is supported by the upper shoulder 68 of the column conductors 60 and 60'. Two machine screws 74 with compression washers 78 are received by holes 76 on the opposing edges of the printed circuit board 46 not used for the sleeve connectors 54 and along a line generally bisecting the printed circuit board 46. The machine screws 74 extend through the printed circuit board 46 and are received by resilient standoffs 80 then by threaded holes 82 in headers 84 opening toward the rear of panel control 16. The machine screws 74 are tightened so as to slightly compress the standoffs 80 thereby firmly holding the printed circuit board 46 between the upper shoulders of the column conductors 60 and 60' and the lower edge of the head of the machine screws 74. The resilient standoffs 80 are injection molded and connected with a tie bar 86 of molded material to aid in positioning them for assembly.

Referring to FIGS. 4 and 2, the printed circuit board 46 for a panel control having two input terminals 36 and two output terminals 40 holds a single board connector 44. The output terminals 40 from the contact block 38 connect with the pin conductors 50 located in the first column of the board connector 44 whereas the input terminals to the transformer 34 and lamp 32 connect with the pin connectors in the second column of the board connector 44.

This distinction ensures that the output terminals 40 to the contact block 38 receive only the 24 volts signal used by the I/O board 22 (shown in FIG. 1) to sense contact closure and the input terminals 37 to the lamp 32 receive the 120 volts signal used the I/O board 22 to activate indicator lamps. Importantly, the segregation of the connector pins 50 by column allows the wires of the harness 18 to be identified as to input and output and connected to the I/O board 22 appropriately prior to selection of the specific panel control 16 to which they will be connected.

Figure 5:
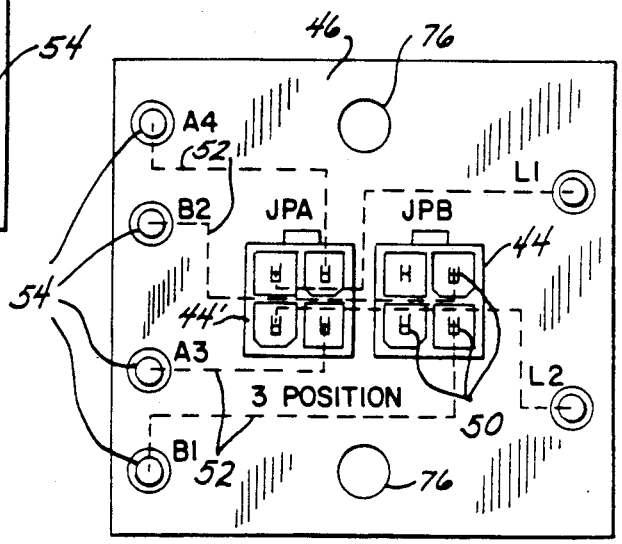
FIG. 5 is a plan view of the printed circuit board similar to the circuit board of FIG. 4 but for accepting two harness connectors for use with a panel control having two output contacts and a single indicator lamp.

In an alternative embodiment for use with a panel control having multiple contacts or contact positions and hence multiple output terminals 40, a printed circuit board 46, shown in FIG. 5, has additional sleeve connectors 54 (labeled B1, A2, B3, A4) to accommodate connections to four output terminals 40 and 40' (as shown in FIG. 2). The additional input terminals require an additional board connector 44 to preserve the output and input column convention as described above. Connection of this panel control 16 requires two harness connectors 42 and hence two cables 20 of the harness 18. For a prewired harness 18 used with a standard front panel 12, this use of two cables 20 will reduce by one the number of panel controls that may be accommodated by the harness 18. Accordingly, one less panel control 16 is affixed to panel 12 and the empty hole 14 is filled with a plug.

It will be appreciated that those terminals 40 or 36 not connected by means of column conductors 60 may be connected with SEMS and saddle clamps to conventional wiring, and thus to other devices. Such panel controls 16 with mixed connections (to the harness 18 and to conventional wiring) may be useful for panel controls 16 that perform safety functions, such as an emergency stop button. The emergency stop button should signal the industrial controller of its condition but also directly stop the process in question. A direct connection from the panel control 16 to the controlled process provides positive stopping of the device even if there is a programming error or damage to the industrial controller.

The above described adapter is attached to a panel control 16 by first removing the SEMS and saddle clamps from the appropriate terminals 40 and 36 of the panel control 16 and installing the column conductors 60 and 60' by threading them into the holes 41 and 37 of the terminals 40 and 36 until the lock washers 72 are properly compressed. The axial symmetry of the column conductor 60 and 60' ensure that the pin ends 56 are properly aligned with the sleeve connecters 54 of the printed circuit board 46. The upper shoulders 68 of the column conductors 60 and 60' then lie in a single plane. The printed circuit board 46 is then aligned and pushed toward the column conductors 60 and 60' so that the pin ends 56 are received by the appropriate sleeve connectors 54. The input terminals 36 and the output terminals 40 are staggered so that the printed circuit board 46 may only fit in one orientation. The machine screws 74 are then inserted in the holes 76 in the printed circuit board 46 and then through the resilient standoffs 80 to be engaged in threaded holes 82 in the header screws 84.

The above description has been that of a preferred embodiment of the present invention. It will occur to those who practice the art that many modifications may be made without departing from the spirit and scope of the invention. For example other types of panel controls having different numbers of input and output terminals may be readily used with simple modifications of the above described adapter. In order to apprise the public of the various embodiments that may fall within the scope of the invention, the following claims are made.

I claim:

1. In an industrial panel control containing a contact for interrupting an electrical circuit, said contact being connected to the electrical circuit by means of at least two terminals having threaded holes to receive screws, an adapter comprising:
   an electrical connector for receiving a corresponding mating connector of the electrical circuit and having at least two conducting elements attached to and supported by an insulating support;
   at least one electrical sleeve connector attached to the insulating support and electrically connected to one of said conducting elements; and
   a columnar conductor having a primary end for interfitting with the threaded hole of one of said terminal and a secondary end received by the electrical sleeve connector for conducting electricity between the terminal and one of the conducting elements of the electrical connector.

2. The adapter of claim 1 wherein the primary end of the columnar conductor is threaded for receipt by the threaded hole of one of the terminals.

3. The adapter of claim 1 wherein the second end of the columnar conductor is radially symmetric to be received by the electrical sleeve connector at any angle about its axis.

4. The adapter of claim 1 wherein the insulating support is a printed circuit card and the sleeve connectors are attached to the conducting elements by printed circuit wiring.

5. The adapter of claim 1 wherein the secondary end of the columnar conductor includes a shoulder for preventing motion of the insulating support toward the terminal means.

6. An industrial panel control containing an electrical switch having an insulating frame and holding a contact for connecting to and interrupting an electrical circuit comprising:
   a first and second threaded electrical terminal connected to each side of the contact;
   an electrical connector for receiving a corresponding mating connector and having one or more conducting elements attached to and supported by an insulating support;
   a first and second electrical sleeve connector attached to the insulating support and electrically connected to first and second conducting element;
   a first and second columnar conductor having a primary threaded end for being attached to the threaded holes of the terminals and a secondary end received by the sleeve connectors for conducting electricity between the first and second terminal and the corresponding first and second conducting element; and
   a clamping means received by the insulating frame for pressing the insulating support toward the first and second electrical terminal thereby capturing the insulating support between the clamping means and the secondary end of the columnar conductors.

7. In an industrial panel control containing an input and an output circuit accessible by means of input and output terminals having threaded holes to receive screws, an electrical adapter comprising:
   conducting elements arranged in groups of four, attached to and supported by an insulating shell of a first connector,
   the shell arranging the conducting elements along the vertices of a square to form a first and second column;
   conducting means for connecting the input terminals only to the conducting elements of the first column and connecting the output terminals only to the conducting elements of the second column; and
   a key for ensuring that the insulating shell may mate with a shell of a second connector in only one orientation.

8. In an industrial panel controller containing an input and output circuit for providing signals to and receiving signals from an electrical circuit, the input and output circuits being accessible by means of an input and output terminal having threaded holes to receive screws, an adapter comprising:
   an electrical connector associated with a corresponding mating connector of the electrical circuit and having at least four conducting elements attached to and supported by an insulating support, the support arranging the conducting elements along the vertices of a square to form a first and second column;
   a plurality of electrical sleeve connectors corresponding in number to the conducting elements and attached to the insulating support and electrically connected to the corresponding conducting elements;
   a plurality of columnar conductors corresponding in number to the electrical sleeve connectors and having primary ends for interfitting with the threaded holes of the input and output terminals and a secondary end received by corresponding electrical sleeve;
   wherein the electrical sleeve connectors receiving columnar conductors interfitting with input terminals are connected to conducting elements only in the first column and the electrical sleeve connectors receiving columnar conductors interfitting with output terminals are connected to conducting elements only in the second column.

* * * * *

UNITED STATES PATENT AND TRADEMARK OFFICE
CERTIFICATE OF CORRECTION

PATENT NO. : 5,040,995

DATED : August 20, 1991

INVENTOR(S) : Frank J. Graninger et al

It is certified that error appears in the above-identified patent and that said Letters Patent is hereby corrected as shown below:

Col. 2, line 28, "enviorment" should be --environment--.

Col. 2, line 54, "pemit" should be --permit--.

Signed and Sealed this

Twelfth Day of January, 1993

Attest:

DOUGLAS B. COMER

*Attesting Officer*   *Acting Commissioner of Patents and Trademarks*